United States Patent
Pan

(10) Patent No.: US 6,380,506 B1
(45) Date of Patent: Apr. 30, 2002

(54) USE OF HOT CARRIER EFFECTS TO TRIM ANALOG TRANSISTOR PAIR

(75) Inventor: Yang Pan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/435,433

(22) Filed: Nov. 22, 1999

(51) Int. Cl.$^7$ .......................... B23K 26/00; G01R 15/12
(52) U.S. Cl. .................................... 219/121.12; 324/769
(58) Field of Search ................... 219/121–12; 324/769; 326/16, 83

(56) References Cited

U.S. PATENT DOCUMENTS

| 4,182,024 A | 1/1980 | Cometta | 29/571 |
| 5,587,665 A | 12/1996 | Jiang | 326/16 |
| 5,625,288 A | * 4/1997 | Snyder et al. | 324/158.1 |
| 5,808,272 A | 9/1998 | Sam et al. | 219/121.68 |

\* cited by examiner

Primary Examiner—Samuel M. Heinrich
(74) Attorney, Agent, or Firm—George O. Saile; Rosemary L. S. Pike

(57) ABSTRACT

In this invention hot carrier stress of a transistor allows trimming of an offset voltage of an integrated circuit by producing permanent damage to the transistor by means of interface state generation. The hot carrier stress is applied to the integrated circuit for a period of time and the offset voltage is measured. The process is repeated until the offset voltage is within specification. Probe pads are used to allow probing of the circuitry and application of the required voltages. The circuit used to demonstrate the technique is a differential amplifier but offset voltages in other integrated circuits can be adjusted using the method of high voltage stress a transistor. Other high voltage stress techniques like Fowler-Nordheim tunneling can also be used.

10 Claims, 1 Drawing Sheet

USE OF HOT CARRIER EFFECTS TO TRIM ANALOG TRANSISTOR PAIR

BACKGROUND OF THE INVENTION

1. Field of Invention

This invention relates to integrated circuits and in particular to trimming transistors in analog circuits.

2. Description of Related Art

As analog integrated circuits are created with sub-micron technology it is becoming more and more difficult to trim pairs of transistors that form a differential circuit or other critical configurations. Conventional trimming is done by laser trimming resistors in the circuit or by adding an EEPROM. A means is needed to adjust offset voltages or threshold voltages without requiring a resistive device which is becoming quite small to be trimmed.

In U.S. Pat. No. 5,808,272 (Sun et al.) is shown a laser system and processing method for functionally trimming semiconductor devices without inducing performance drift or malfunction including spurious optoelectric response in adjacent circuitry. In U.S. Pat. No. 5,587,665 (Jiang) a method using a special test circuit tests performance degradation resulting from hot carrier stress. In US U.S. Pat. No. 4,182,024 (Cometta) a pulsed laser is used to trim transistors in a combined bipolar and junction field effect integrated circuit to achieve a balanced circuit performance.

As semiconductor geometry's shrink and trimming offset voltages becomes more difficult, methods other than laser trimming become important. These methods can take the form of altering transistor characteristics rather than laser trimming resistors to achieve an offset that is within specification. By doing this the geometry's are not affected and extra space is not allocated to product trimmings.

SUMMARY OF THE INVENTION

In this invention a method is described to trim the offset voltage of an analog differential transistor pair. The method described can be used for other circuits where an offset or threshold voltage needs to be adjusted to bring the particular circuit into specification. In the circuit example used to demonstrate the method of this invention, a differential amplifier is connected between Vdd and circuit ground. External contact pads are connected to each terminal of the two transistors in the differential amplifier. The size of the pads are dependent upon the method of electrical contact and are larger when mechanical probes are used than when an electronic beam is used.

The differential amplifier is powered on with inputs connected together, and the offset of the transistor pair is measured. If an offset in excess of a specification is measured, one of the transistors are trimmed. The trimming is done to the selected transistor by hot carrier stressing that transistor for a period of time to cause permanent damage to the transistor in the form of interface state generation. This changes the threshold voltage of the transistor and the corresponding offset voltage of the differential transistor pair. The rate of offset voltage reduction is noted with respect to the amount of stress time, and additional stress is projected based upon the previous changes in offset voltage. The process is repeated until the offset voltage is within specifications.

Other high voltage stress like Fowler-Nordheim tunneling can be used to produce permanent damage to the transistor being trimmed and change the transistors threshold voltage. In addition to a differential transistor pair circuit, other circuits can be trimmed using the method of this invention to adjust the threshold voltage of a transistor to bring the actual characteristics of a circuit within specification.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
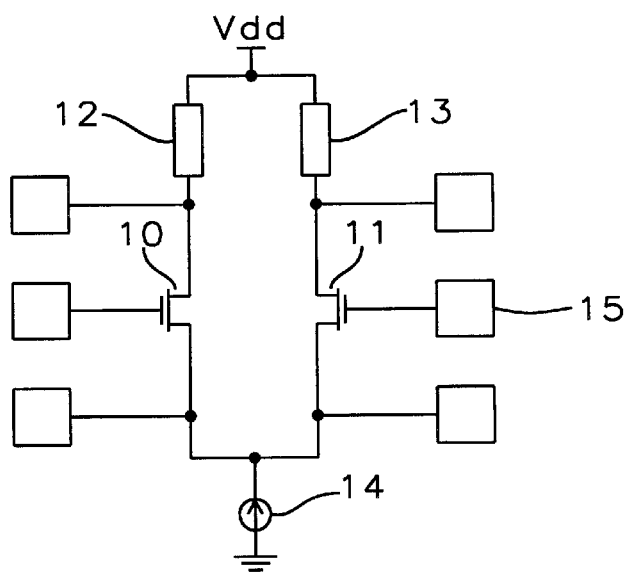
FIG. 1 is a circuit diagram of a differential circuit to be trimmed.

In FIG. 1 is shown a circuit diagram of a differential amplifier connected between Vdd and circuit ground. Two transistors 10 11 are connected to Vdd each through a load 12 13. The source of the two transistors 10 11 are connected together and then to a current source connected to ground. Probe pads are connected to the gate, the source and the drain of each of the two transistors 10 11. With the differential amplifier connected between Vdd and ground, the two inputs of the differential amplifier are electrically tied together, and a stress voltage is applied to one of the two transistors 10 and 11. With the two inputs tied together, the output of the differential amplifier will exhibit the offset voltage. If, for example, the differential amplifier is designed for a 5V operation, a gate to source voltage $V_{GS}$=2.5V and a drain to source voltage $V_{DS}$=7.5V is applied until the output of the differential amplifier begins to change. The stress voltage is continued to be applied until the output of the differential amplifier indicates that the offset voltage is within circuit specifications.

The probe pads 15 shown in FIG. 1 are considerably larger when mechanical probing is used than when E-beam is used to probe the circuitry. Mechanical probe pads can be as large as 60×60 micrometers compared to 2×2 micrometers for pads probed by an E-beam which saves considerable space. When an E-beam is used a particular node will be charged to a level that will cause hot carriers to be induced into the transistor being adjusted. The E-beam energy used is low, 5–1 KeV for instance, so as not induce E-beam damage. The two inputs to the differential amplifier are electrically tied together and the amplifier offset is electrically measured at the output of the differential amplifier.

The previous discussion has shown how the offset voltage of the differential amplifier circuit shown in FIG. 1 can be trimmed to bring the offset voltage within specification. Other circuitry not containing a differential amplifier can be trimmed in a similar way with the appropriate placement of probe pads 15 within the circuitry. Stressing the circuitry can also be done using Fowler-Nordheim tunneling. The Fowler-Nordheim tunneling produces interface state generation like that done with hot carrier stressing which changes the offset voltage of the transistor that is being stressed.

Figure 2:
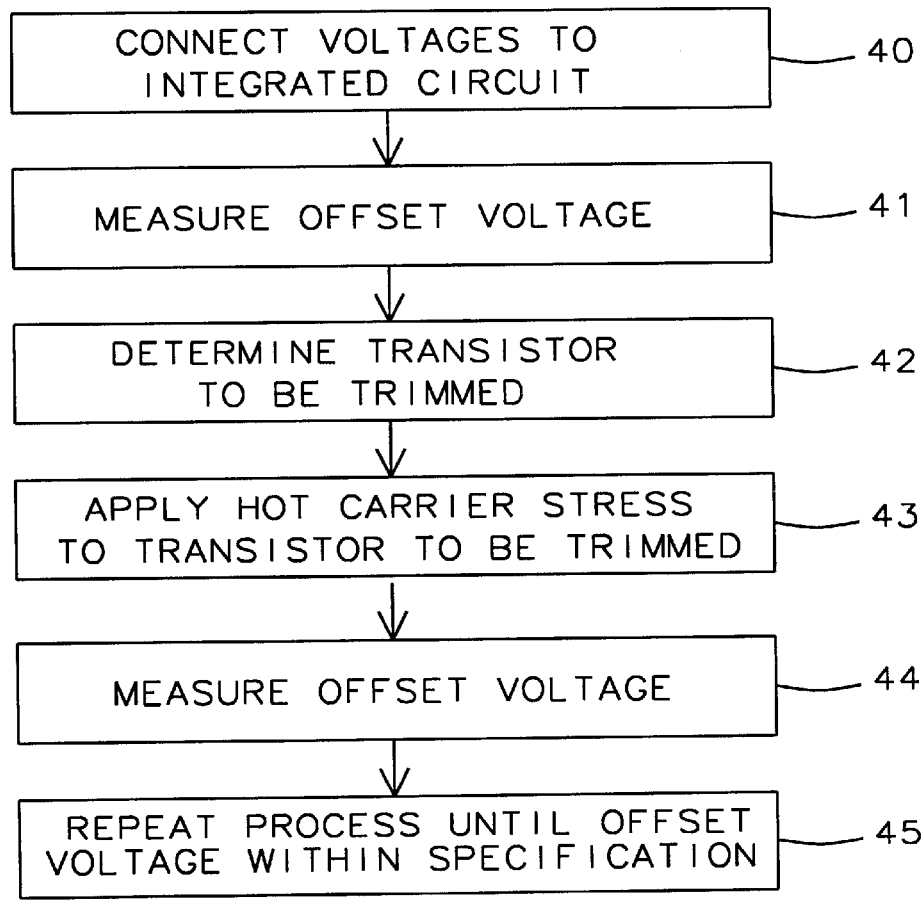
FIG. 2 is a flow diagram of the method of trimming the offset voltage of a differential circuit.

In FIG. 2 is shown a method for stressing transistors in an integrated circuit to change an offset voltage to be within specification. Voltages are connected to the integrated circuit to allow a offset voltage to be measured 40. The offset voltage is measured 41 and the transistor to be trimmed is determined 42. Voltages are applied to the integrated circuit to hot carrier stress the transistor to be trimmed 43. The hot carrier stress is maintained on the transistor to be trimmed for a period of time. The offset voltage of the integrated circuit is measured 44, and the process is repeated until the offset voltage is measured to be within specification 45. The amount of time that the hot carrier stress is applied versus the change in offset voltage is used determine how long the next application of the hot carrier stress is applied.

While the invention has been particularly shown and described with reference to preferred embodiments thereof, it will be understood by those skilled in the art that various changes in form and details may be made without departing from the spirit and scope of the invention.

What is claimed is:

1. A method for trimming transistors in an integrated circuit, comprising:
   a) connecting voltage to an integrated circuit,
   b) measuring an offset voltage between transistors in said integrated circuit,
   c) determining which transistor to be trimmed,
   d) applying hot carrier stress to said transistor to be trimmed,
   e) stressing said transistor and measuring said offset voltage between said transistors,
   f) repeating said hot carrier stress until said offset voltage meets specification.

2. The method of claim 1, wherein applying hot carrier stress produces an interface state generation to produce permanent changes to said transistor being trimmed.

3. The method of claim 1, wherein stressing said transistor is done using electron beam to allow small contact pads connected to circuitry to be used.

4. The method of claim 1, wherein stressing said transistor is done using high voltage Fowler-Nordheim tunneling to create an interface state generation to produce permanent changes to said transistor being trimmed.

5. A method for trimming transistors in a differential circuit, comprising:
   a) connecting voltage to a differential transistor pair,
   b) measuring an offset voltage of said differential transistor pair,
   c) determining which transistor of said differential transistor pair to be trimmed,
   d) applying hot carrier stress to said transistor to be trimmed for a period of time,
   e) measuring said offset voltage of said transistor pair,
   f) repeating said hot carrier stress until said offset voltage of said transistor pair meets specification.

6. The method of claim 5, wherein applying hot carrier stress produces an interface state generation to produce permanent changes to said transistor being trimmed.

7. The method of claim 5, wherein stressing said transistor is done using electron beam to allow small contact pads connected to circuitry to be used.

8. The method of claim 5, wherein trimming transistors connected in configurations other than said differential transistor pair is done by using the hot carrier stress technique.

9. The method of claim 5, wherein stressing said transistor is done using high voltage Fowler-Nordheim tunneling to create an interface state generation to produce permanent changes to said transistor being trimmed.

10. The method of claim 9, wherein trimming transistors connected in configurations other than said differential transistor pair is done by using the high voltage Fowler-Nordheim technique.

* * * * *